(12) United States Patent
Kwok et al.

(10) Patent No.: US 9,905,646 B2
(45) Date of Patent: Feb. 27, 2018

(54) V-SHAPED EPITAXIALLY FORMED SEMICONDUCTOR LAYER

(71) Applicant: Taiwan Semiconductor Manufacturing Company, Ltd., Hsin-Chu (TW)

(72) Inventors: Tsz-Mei Kwok, Hsinchu (TW); Ming-Hua Yu, Hsinchu (TW); Chii-Horng Li, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/463,411

(22) Filed: Mar. 20, 2017

(65) Prior Publication Data

US 2017/0194434 A1 Jul. 6, 2017

Related U.S. Application Data

(62) Division of application No. 14/584,699, filed on Dec. 29, 2014, now Pat. No. 9,601,574.

(51) Int. Cl.
| | | |
|---|---|---|
| *H01L 29/45* | (2006.01) |
| *H01L 29/08* | (2006.01) |
| *H01L 29/04* | (2006.01) |
| *H01L 29/165* | (2006.01) |
| *H01L 29/161* | (2006.01) |
| *H01L 29/78* | (2006.01) |
| *H01L 29/66* | (2006.01) |
| *H01L 29/16* | (2006.01) |
| *H01L 21/02* | (2006.01) |
| *H01L 21/285* | (2006.01) |

(52) U.S. Cl.
CPC .... *H01L 29/0847* (2013.01); *H01L 21/02529* (2013.01); *H01L 21/02532* (2013.01); *H01L 21/28518* (2013.01); *H01L 29/045* (2013.01); *H01L 29/161* (2013.01); *H01L 29/165* (2013.01); *H01L 29/1608* (2013.01); *H01L 29/45* (2013.01); *H01L 29/66636* (2013.01); *H01L 29/7848* (2013.01)

(58) Field of Classification Search
CPC ............... H01L 29/0847; H01L 29/165; H01L 29/41783; H01L 29/045; H01L 29/1608; H01L 29/665; H01L 29/66636; H01L 29/7848; H01L 29/161; H01L 29/45; H01L 21/02529; H01L 21/02532; H01L 21/28518
USPC .......................................... 257/286, 386, 401
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |
| 8,887,106 B2 | 11/2014 | Ho et al. |
| 2008/0157208 A1 | 7/2008 | Fischer et al. |
| 2009/0321820 A1 | 12/2009 | Yamakawa |

(Continued)

*Primary Examiner* — Caleen Sullivan
(74) *Attorney, Agent, or Firm* — Haynes and Boone, LLP

(57) ABSTRACT

The present disclosure provides a method in accordance with some embodiments. The method includes forming a recess in a source/drain region of a semiconductor substrate, wherein the semiconductor substrate is formed of a first semiconductor material. The method further includes epitaxially growing a second semiconductor material within the recess to form a S/D feature in the recess, and removing a portion of the S/D feature to form a v-shaped valley extending into the S/D feature.

20 Claims, 11 Drawing Sheets

(56) References Cited

U.S. PATENT DOCUMENTS

2014/0282326 A1 9/2014 Chen et al.
2015/0311314 A1 10/2015 Hsiao et al.
2016/0190250 A1 6/2016 Kwok et al.

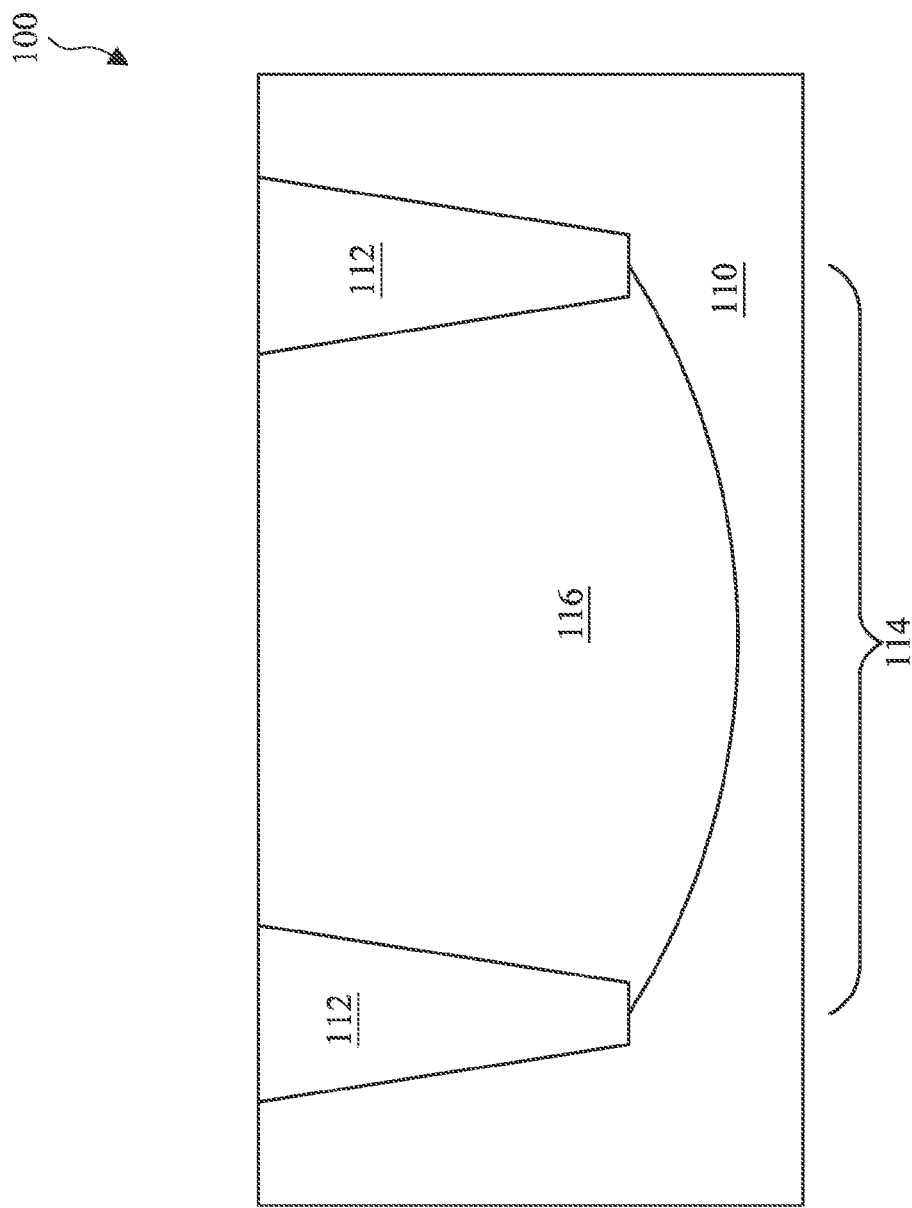

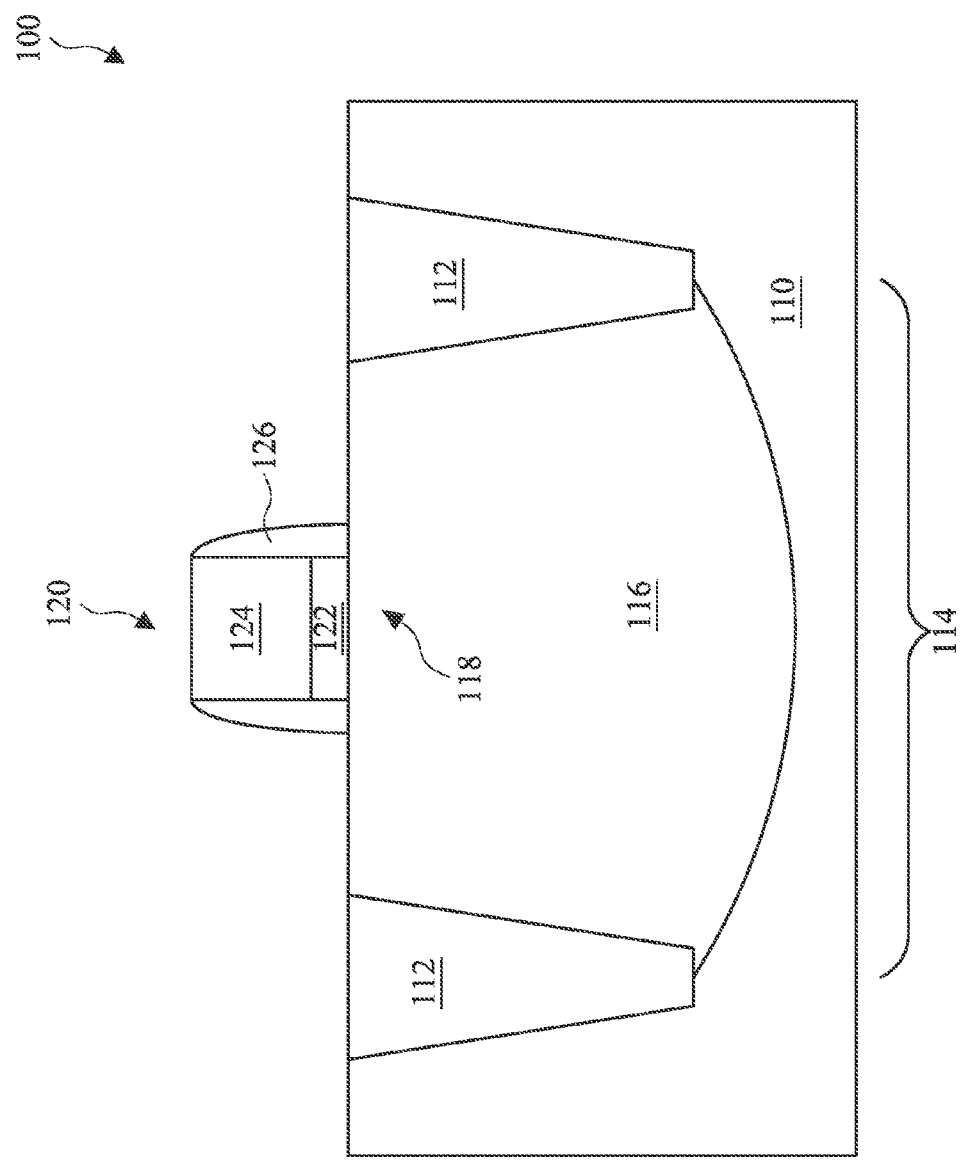

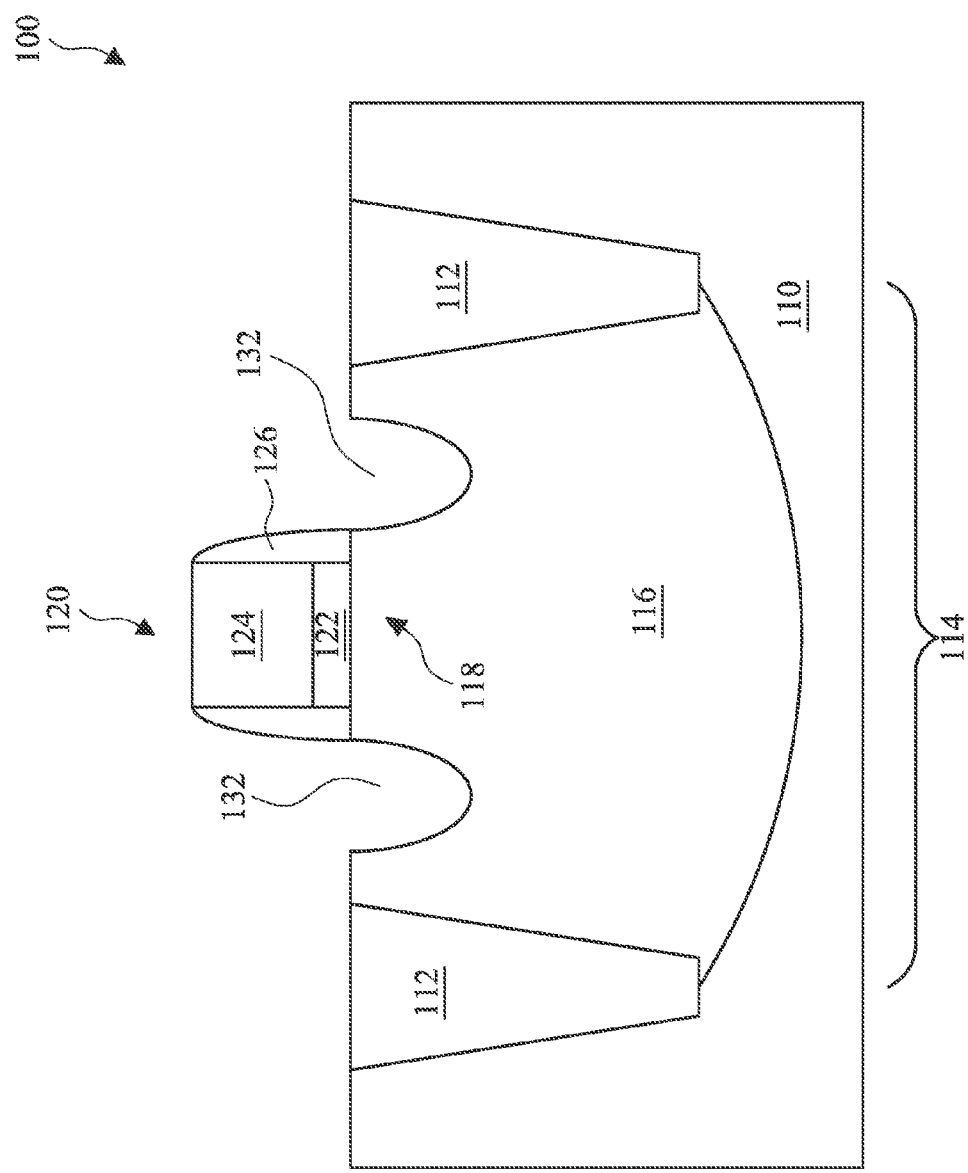

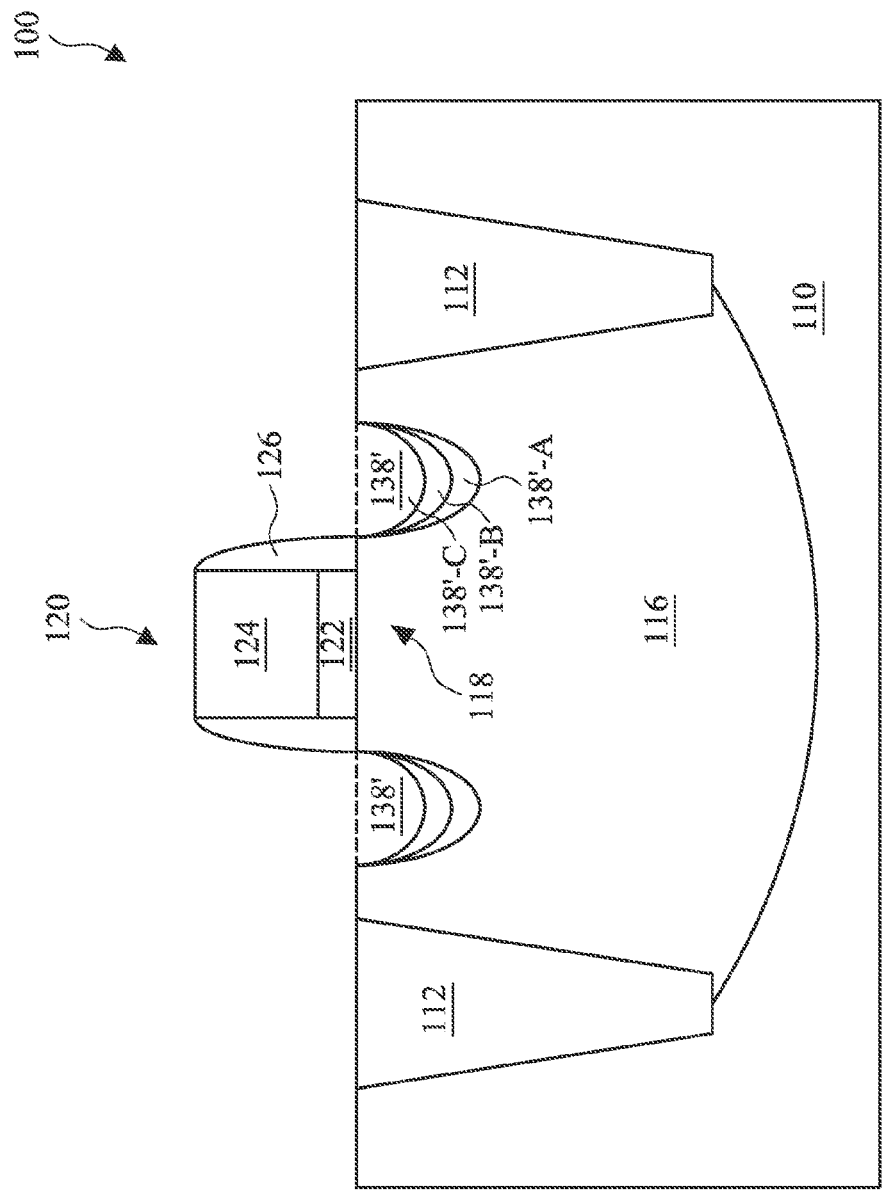

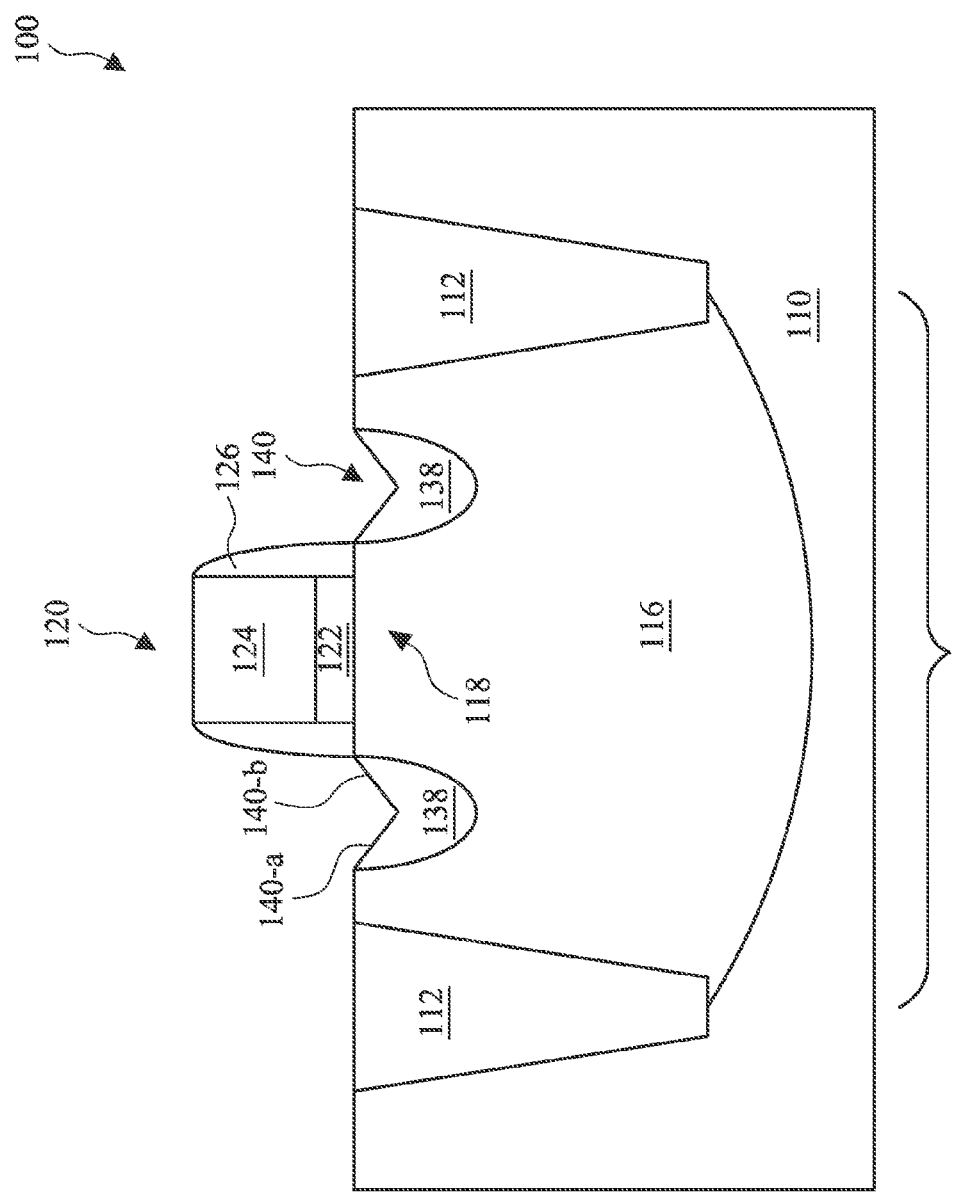

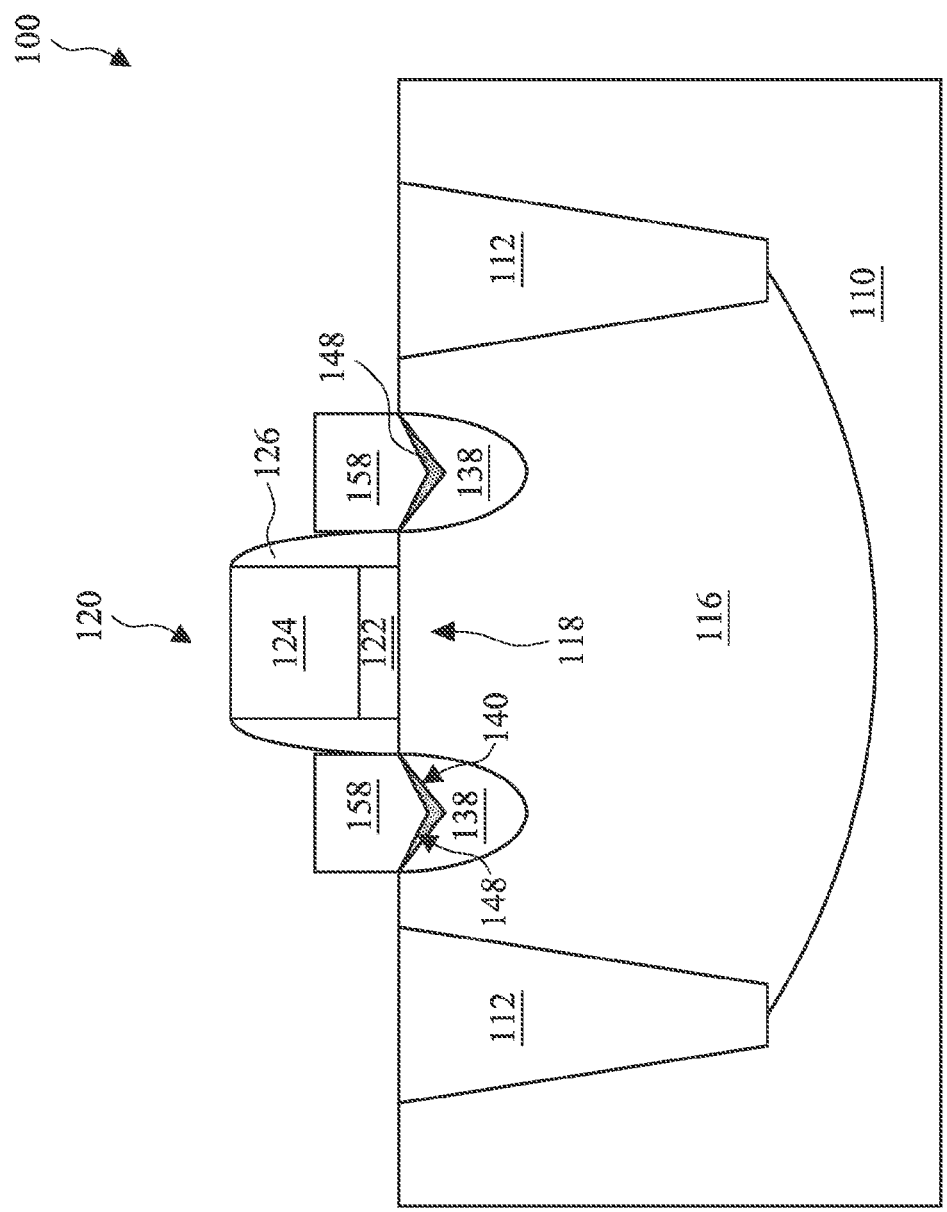

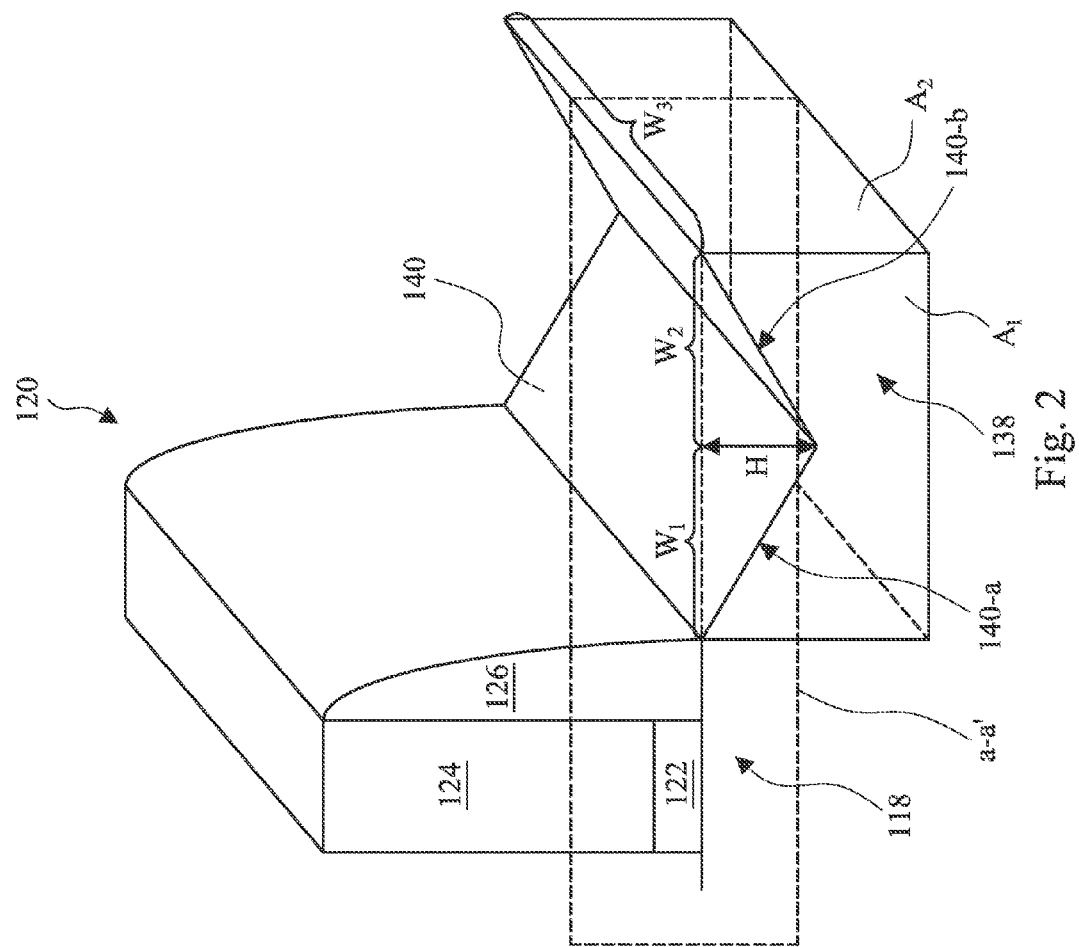

V-SHAPED EPITAXIALLY FORMED SEMICONDUCTOR LAYER

PRIORITY DATA

The present application is a divisional application of U.S. application Ser. No. 14/584,699, filed Dec. 29, 2014, which is hereby incorporated by reference in its entirety.

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Despite advances in materials and fabrication, scaling planar devices such as the conventional MOSFET has proven challenging. For example, such scaling-down is subject to produce a relatively limited area (i.e., small area) that can be used to connect a transistor to other components. As such, the limited area may disadvantageously impact the junction resistance, which in turn may degrade a transistor's switching speed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a perspective view of a semiconductor structure constructed in accordance with some embodiments.

DETAILED DESCRIPTION

Figure 1D:
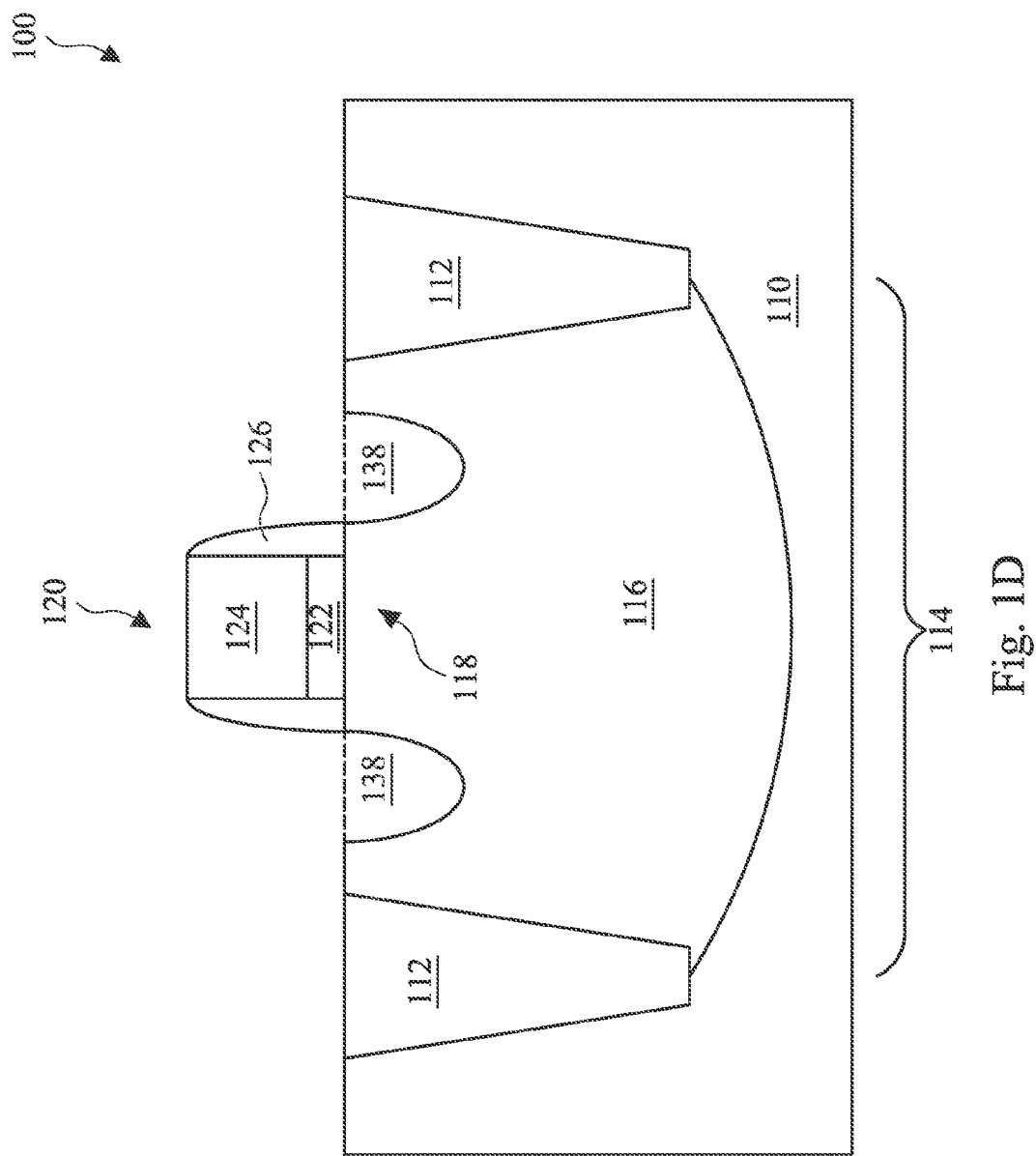
FIGS. 1A, 1B, 1C, 1D, 1D', 1E, 1E', 1F, and 1F' are sectional views of a semiconductor structure at various fabrication stages constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1A, 1B, 1C, 1D, 1D', 1E, 1E', 1F, and 1F' are cross-sectional views of a semiconductor structure 100 at various fabrication stages constructed in accordance with some embodiments. The semiconductor structure 100 and the method of making the same are collectively described in accordance with some embodiments. In one embodiment, the semiconductor structure 100 includes one or more field effect transistors (FETs). Further, although the semiconductor structure 100 is constructed as a planar FET structure, in some embodiments, the disclosed method may be used to make a fin FET (FinFET) structure.

Referring to FIG. 1A, the semiconductor structure 100 includes a semiconductor substrate 110. The semiconductor substrate 110 includes silicon. Alternatively, the substrate includes germanium, silicon germanium or other proper semiconductor materials such as III/V materials. In another embodiment, the semiconductor substrate 110 may include a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

As various examples for illustration, the semiconductor structure 100 includes other components or features. In some embodiments, isolation features, such as various shallow trench isolation (STI) features 112, are formed in the semiconductor substrate 110 and define active regions (or semiconductor regions) 114. The active regions 114 are separated and isolated from each other by the STI features 112. In one example, the top surface of the semiconductor substrate 110 and the top surfaces of the STI features 112 may be coplanar, resulting in a common top surface. In another example, the top surface of the semiconductor substrate 110 and the top surfaces of the STI features 112 are not coplanar, resulting in a three-dimensional structure, such as a fin FET (FinFET) structure.

In some embodiments, the formation of the STI features 112 includes, forming a hard mask with openings that define the regions for STI features; etching the semiconductor substrate 110 through the openings of the hard mask to form trenches in the semiconductor substrate; depositing one or more dielectric material to fill in the trenches; and performing a chemical mechanical polishing (CMP) process. As one embodiment for illustration, the depth of the STI features 112 ranges between about 50 nm and about 500 nm. In one example, the formation of the hard mask includes depositing a hard mask layer; a lithography process to form a patterned resist layer on the hard mask layer; and etching the hard mask layer using the patterned resist layer as an etch mask. In some examples, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD). In some embodiments, the formation of the STI features 112 further includes removing the hard mask after CMP. In another embodiment, the hard mask includes a silicon oxide layer by thermal oxidation and a silicon nitride on the silicon oxide layer by chemical vapor deposition (CVD).

In FIG. 1A, the active region 114 is designed to form a FET, such as a p-type FET (pFET) or an n-type FET (nFET). In some embodiments, a doped well 116 may be formed in one or more active regions 114. In some examples, the doped well 116 includes an n-type dopant, such as phosphorous (P) and/or arsenic (As), distributed in an active region where a pFET is to be formed. The n-type dopant may be introduced to the n-well 116 through an opening of the mask layer by a suitable doping process, such as one or more ion implantation. In some other examples, the doped well 116 includes a p-type dopant, such as boron (B), distributed in an active region where an nFET is to be formed. The p-type dopant may be introduced to the p-well 116 through an opening of the mask layer by a suitable doping process, such as one or more ion implantation. The STI features 112 further function to define the dopants to the desired active regions. In the present example for illustration, the doped well 116 is formed in the active region 114. In one example, the doped well 116 may have a corresponding doping concentration ranging between about $10^{16}$ and $10^{18}$ cm$^{-3}$ of either the n-type or p-type dopant implanted into substrate 110. In another example, the doped well 116 may have a depth ranging between about 0.5 micrometers and 2 micrometers.

Referring to FIG. 1B, a gate stack 120 is formed on the active region 114. The gate stack 120 is overlying and vertically aligned with a channel region 118 defined in the active region 114. Channel region 118 serves as a conductive path when the corresponding FET is turned on during operations.

The gate stack 120 includes a gate dielectric feature 122 disposed on the semiconductor substrate 110 and a gate electrode 124 disposed on the gate dielectric feature 122. The semiconductor structure 100 may further include gate spacers 126 disposed on sidewalls of the gate stack 120.

The gate dielectric feature 122 includes a gate dielectric material, such as silicon oxide or a suitable dielectric material having a higher dielectric constant (high-k dielectric material). In accordance with various illustrative embodiments, the gate dielectric feature 122 may include more than one dielectric material layers. For example, the gate dielectric feature 122 may include an interfacial dielectric layer, such as silicon oxide, and a high-k dielectric material layer on the interfacial layer.

The gate electrode 124 includes a conductive material layer, such as doped polysilicon, metal, metal alloy, metal silicide, or a combination thereof. In some embodiments, the gate electrode 124 includes more than one conductive material layers. For example, the gate electrode 124 includes a first conductive layer having a suitable work function on the gate dielectric feature 122 and a second conductive layer on the first conductive layer. In one example, the first conductive layer is a p-type work function metal layer when forming a pFET device. Examples of p-type work function metal layers include tantalum nitride and/or titanium nitride. In another example, the first conductive layer is a n-type work function metal layer when forming a nFET device. Examples of n-type work function metal layers include titanium and/or aluminum. The second conductive layer includes aluminum, tungsten, copper, doped polycrystalline silicon or a combination thereof.

The gate stack 120 is formed by a procedure that includes various deposition processes and patterning. In one embodiment, an interfacial layer is formed on the semiconductor substrate 110. The interfacial layer may include silicon oxide formed by a proper technique, such as an atomic layer deposition (ALD), thermal oxidation or UV-Ozone Oxidation. The interfacial layer may have a thickness less than 10 angstrom. A high k dielectric material layer is formed on the interfacial layer. The high-k dielectric layer includes a dielectric material having the dielectric constant higher than that of thermal silicon oxide, about 3.9. The high k dielectric material layer is formed by a suitable process such as ALD or other suitable technique. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides. The interfacial layer and the high k dielectric material layer constitute the gate dielectric layer.

In some embodiments, the gate electrode 124 includes polycrystalline silicon. A polycrystalline silicon layer is formed on the gate dielectric layer by a manufacturing technique, such as CVD. In one example, a capping layer may be further formed between the high k dielectric material layer and the polycrystalline silicon layer by a manufacturing technique, such as PVD. The capping layer may include titanium nitride (TiN), tantalum nitride (TaN) or a combination thereof in some examples. The capping layer may serve one or more functions, such as diffusion barrier, etch stop, and/or protection.

After the depositions, the gate material layers are patterned to form the gate stack 120. The patterning of the gate stack 120 includes a lithography process and etching. A lithography process forms a patterned resist layer. In one example, the lithography process includes resist coating, soft baking, exposing, post-exposure baking (PEB), developing, and hard baking. The gate stack material layers are thereafter patterned by etching using the patterned resist layer as an etching mask. The etching process may include one or more etching steps. For example, multiple etching steps with different etchants may be applied to etch respective gate stack material layers.

In other embodiments, the patterning of the gate stack material layers may alternatively use a hard mask as an etching mask. The hard mask may include silicon nitride, silicon orynitride, silicon oxide, other suitable material, or a combination thereof. A hard mask layer is deposited on the gate stack material layers. A patterned resist layer is formed on the hard mask layer by a lithography process. Then, the hard mask is etched through the opening of the patterned resist layer, thereby forming a patterned hard mask. The patterned resist layer may be removed thereafter using a suitable process, such as wet stripping or plasma ashing.

The gate spacers 126 include a dielectric material and may have one or more films. In some embodiments, the fate spacers 126 include silicon oxide, silicon nitride, silicon oxynitride, other suitable dielectric material, or a combination thereof. The gate spacers 126 are formed by deposition and anisotropic etch (e.g., dry etch).

Referring to FIG. 1C, recesses 132 are formed in the semiconductor substrate within the active region 114 by an operation that includes etching. In some embodiments, the recesses 132 may be formed using, such as a wet (and/or dry) etch process, selectively etch the material of the substrate 110. In furtherance of the embodiments, the gate stack 120, the gate spacers 126, and the STI 112 collectively function as an etching hard mask, thereby forming the recesses 132 in the source and drain regions. In some examples, an etchant such as carbon tetrafluoride (CF4), tetramethylammonium hydroxide (TMAH), other suitable etchant, or a combination thereof is used to form the recesses 132. In some embodiments, the recesses 132 are formed with a width ranging from 200 Å and about 800 Å. A cleaning process may follow the etching process using a suitable chemical. The recesses 132 are substantially aligned with the gate structure, particularly aligned with outer edges of the gate spacers 126.

Continuing in FIG. 1D, the recesses 132 are filled with a semiconductor material by a deposition process, thereby epitaxially growing source and drain (S/D) features 138 in crystalline structure. In accordance with various illustrative embodiments, the S/D features 138 may be formed by a suitable process, such as CVD process. In some alternative embodiments, the S/D features 138 may be formed by a selective deposition process. The deposition process to form the S/D features 138 involves chlorine for etching effect and makes the deposition selective. The selective deposition process is designed and tuned to epitaxially grow such that the S/D features 138 formed in the recesses 132 include the semiconductor material in a crystalline structure.

Referring still to FIG. 1D, the semiconductor material (i.e., 138) may be different from or the same as that of the substrate 110. For example, the semiconductor material includes silicon, silicon carbon, or silicon germanium while the substrate 110 is a silicon substrate. In some embodiments, while the semiconductor material is silicon and the substrate 110 is a silicon substrate, the semiconductor material is generally doped so as to form the S/D features. More specifically, for example when doped well 116 is a p-type doped well, the S/D features 138 may be n-type doped (i.e., doped with phosphorous dopants). Similarly, when doped well 116 is an n-type doped well, the S/D features 138 may be p-type doped (i.e., doped with Boron dopants).

Regardless of dopant type, dopants may be introduced by in-situ doping during the epitaxial growth of the S/D features 138. Although the S/D feature 138 shown in FIG. 1D is a single layer, in some embodiments, the S/D feature 138 may include multiple layers, wherein each layer is doped with respective doping concentration. For example, FIG. 1D' shows S/D feature 138' formed of multiple layers. In that regard, the S/D feature 138' may include three layers of n-type or p-typed doped semiconductor material layers. A first layer 138'-A in contact with the doped well 116 may be formed first with light doping concentration in order to avoid leakage current flowing in to/out from the S/D feature. The doping concentration for the first layer 138'-A is between $5 \times 10^{19} \sim 1 \times 10^{21}$ cm$^{-3}$. A second layer 138'-B with a much higher doping concentration may be formed subsequently on the top of the first layer 138'-A in order to provide suitable S/D features. For example, the doping concentration for the second layer 138'-B is between $2 \times 10^{21} \sim 4 \times 10^{21}$ cm$^{-3}$. Lastly, a third layer 138'-C deposited on the top of the second layer 138'-B may be doped with a doping concentration lying between the ones for the first and second layers. For example, the doping concentration for the third layer 138'-C is between $5 \times 10^{19} \sim 1 \times 10^{21}$ cm$^{-3}$.

In some alternative embodiments, the semiconductor material is chosen for proper strained effect in the channel region 118 such that the corresponding carrier mobility increases. In one example, the semiconductor material is silicon germanium (SiGe) doped with boron for S/D features 138 while the substrate 110 is a silicon substrate. The SiGe layer may be formed by epitaxially growing a silicon germanium layer using a precursor free of Cl. In furtherance of the embodiment, the precursor includes a silicon-containing chemical (such as SiH$_4$) and a germanium-containing chemical (GeH$_4$). In some examples, the SiGe layer 138 is formed with n-type dopant in the recess for nFET S/D region and with p-type dopant in the recess for pFET S/D region. In yet some examples, the SiGe layer 138 is dopant-free; has a germanium concentration ranging from about 10% to about 40% (atomic percentage). In some examples, the precursor during the epitaxy growth has a low partial pressure ranging from about 1 Torr to about 10 Torr.

In another example, the active region 114 is for an nFET, the semiconductor material is silicon carbon (SiC) doped with phosphorous (P) for S/D features 138 while the substrate 110 is a silicon substrate. The SiC layer 138 includes P dopant with a low P doping concentration less than $1 \times 10^{20}$ cm$^{-3}$, or $0 \sim 1 \times 10^{20}$ cm$^{-3}$. The P dopant may be introduced by in-situ doping. During the epitaxial growth of the SiC layer 138, the precursor further includes phosphorous-containing chemical, such as phosphine (PH$_3$). The P concentration in the SiC layer 138 may be not enough for S/D features. S/D features of an nFET may have a P dopant concentration greater than $1 \times 10^{20}$ cm$^{-3}$. The P concentration of the SiC passivation layer 136 is so tuned such that to provide a grading P concentration with smooth transition from the substrate to the S/D features and the P concentration is not too high to cause leakage concerns.

Figure 1E:
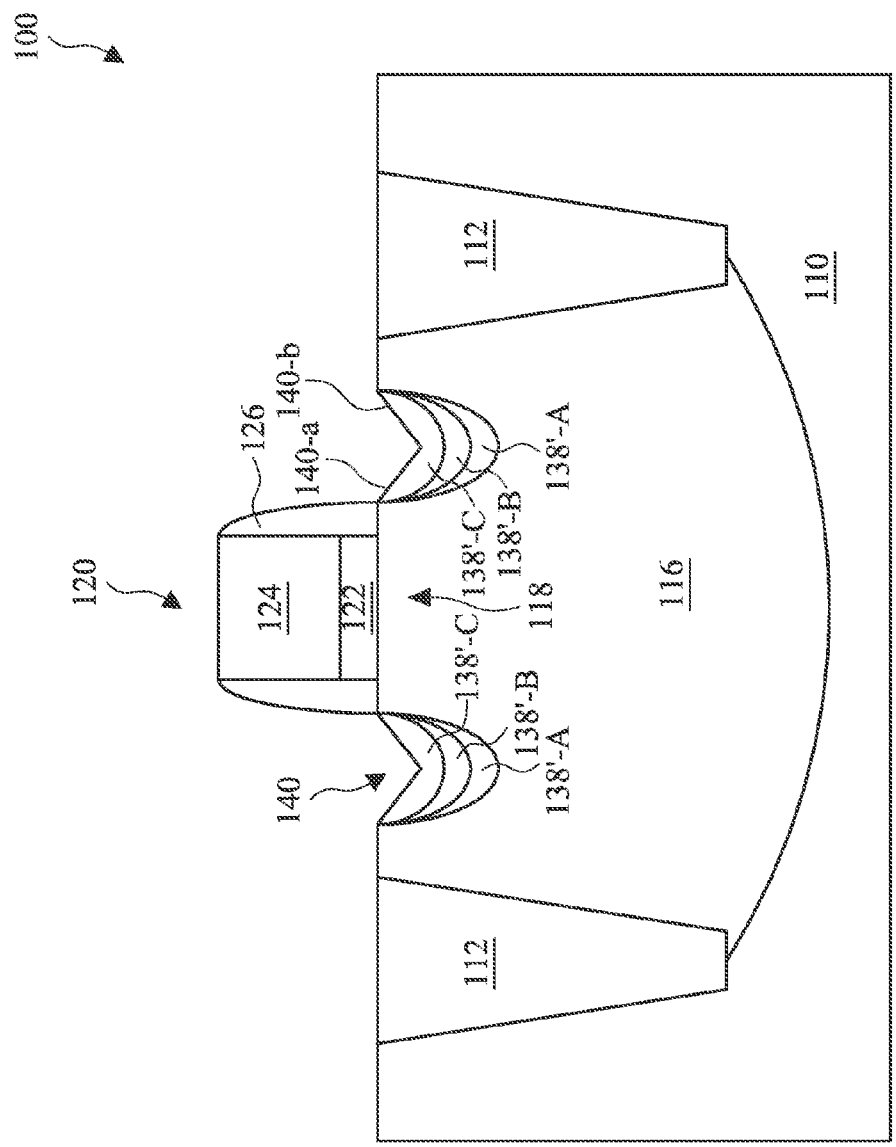

Referring now to FIG. 1E, a v-shaped valley 140 is formed on the top surface of the S/D features 138. In some embodiments, the valley 140 may be formed by a chemical vapour etching process using gaseous chlorine (Cl$_2$) or hydrogen chloride acid (HCl). The gaseous Cl$_2$ and/or HCl is delivered into a chamber containing the semiconductor structure 100 to perform the etching process. In some embodiments, the epitaxial growth of the S/D features 138 and the chemical vapour etching process may be performed either in a same chamber or in a respective chamber. In an alternative embodiment, while the epitaxial growth of the S/D features 138 and the chemical vapour etching process is performed in the same chamber, the chemical vapour etching process may be integrated into the epitaxial growth as a sub-step. More specifically, right after growing the S/D features 138, a precursor gas used to grow the S/D features and corresponding dopant gas may be stopped to flow and subsequently the gaseous Cl$_2$ and/or HCl continues to flow into the chamber to etch the S/D features. For the example of growing n-type Si as the S/D features 138, the flowing of precursor gases, SiH$_4$ (used to grow Si) and PH$_3$ (used to dope the grown Si), may be stopped upon a request thickness of layer 138 being reached and the flowing of gaseous Cl$_2$ or HCl may start to perform the etching process.

Still referring to FIG. 1E, since the epitaxially grown S/D features 138 are formed of single crystalline silicon, the reaction between Si and Cl reaches a most stable state (i.e., the least activation energy) at the facet (111) of the single crystalline Si, resulting in such v-shaped valley as shown in FIG. 1E. Generally, surfaces 140-a and 140-b of the valley 140 exhibit, but not limited to, the (111) facets.

As discussed above, S/D feature 138 may include three layers of n-type or p-typed doped semiconductor material layers. FIG. 1E' shows such an embodiment with v-shaped valley 140 being formed through S/D feature 138'. In accordance with an illustrative embodiment, v-shaped valley 140 extends only through the third layer 138'-C. In some other embodiments, v-shaped valley 140 may extend through to the second layer 138'-B, or extend through the first layer 138'-A.

Figure 1F:
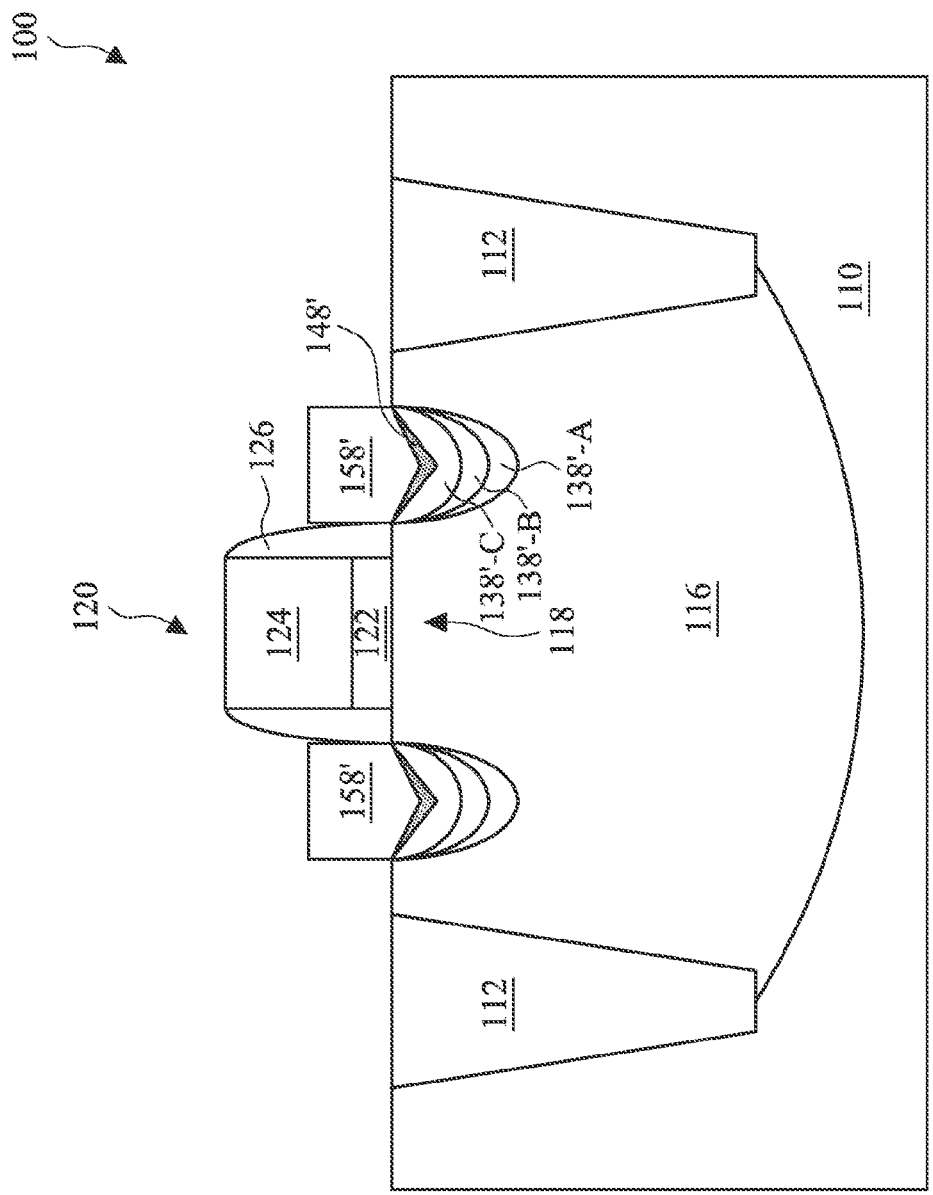

In some embodiments, as shown in FIG. 1F, a silicide process may be performed on the surface of the valley 140. The silicide process generally includes depositing a metal layer (e.g., titanium (Ti) layer) on the surface of valley 140 and subsequently annealing the semiconductor structure 100 so as to form a metal silicide (titanium silicide (TiSi)) layer/feature 148. The deposition of the metal layer may be performed by using chemical vapour deposition (CVD) or sputtering. The silicide process to form the metal silicide layer, as a buffer, may in turn provide an advantage to further reduce the contact resistance between the D/S features (e.g., 138) and outer interconnection lines, such as copper interconnection lines. Additionally, a contact feature 158 is formed in conjunction with the top surface of the silicide layer 148. Generally, the contact feature 158 is formed of conductive material, such as copper.

FIG. 1F' shows a similar silicide process and contact feature being formed over the S/D feature 138' of FIG. 1E'. The process described above with respect to FIG. 1F is applicable to the formation of the silicide feature 148' and contact feature 158' shown in FIG. 1F'.

FIG. 2 shows a perspective view of the semiconductor structure 100 in accordance with various embodiments. For the sake of clarity and the symmetric property of the semiconductor structure 100, only half of the structure is shown in FIG. 2. As shown in FIG. 2, a v-shaped valley 140 is on the top surface of one of the S/D features 138. As mentioned above, although the semiconductor structure 100 is shown as a planar FET structure, the semiconductor structure 100 may be constructed as a FinFET structure as well.

To further illustrate the implementations of the valley 140 providing a greater contact area of the S/D features compared with the area a flat surface of the S/D features, a quantitative analysis is provided. As shown in FIG. 2, a cross-sectional plane A1 of the valley 140 along axis a-a' includes a valley depth "H", a first width "W1", and a second width "W2". Another plane A2 perpendicular to the plane A1 shown in FIG. 2 includes a width "W3". Generally, the plane A1 is in parallel with an axis that extends from the drain to source or source to drain features, and the plane A2 is perpendicular to the plane A1. In some embodiments, W1 may be equal to W2. According to the present embodiments, the valley depth "H" lies between 5 to 20 nanometers. The valley depth "H" may be tuned to any suitable value in accordance with any desired application. In conventional semiconductor structure, the S/D features have a flat top surface, which means that no valley 140 is present. As such, the area on the top surface of S/D feature is estimated as: $(W1+W2) \times W3$. However, valley 140 has a top surface area (top surface of valley 140 includes surfaces 140a and 140b) that is estimated as: $((W1+H)^{1/2}+(W1+H)^{1/2}) \times W3$. According to the Pythagorean theorem, in any right triangle, the length of the hypotenuse (i.e., $(W1+H)^{1/2}$ or $(W1+H)^{1/2}$) is always greater than any length of the remaining two sides (i.e., W1, W2).

Accordingly, the top surface of S/D features 138 provides a greater surface contact area as compared to conventional flat top S/D features. Such greater contact area advantageously provides a greater area that can be used to be in conjunction with a silicide layer and/or a conductive contact feature, and thus reduce contact resistance. This reduction of the contact resistance may not only improve power consumption of the semiconductor structure 100 but also enhance the performance of the semiconductor structure 100.

Figure 3:
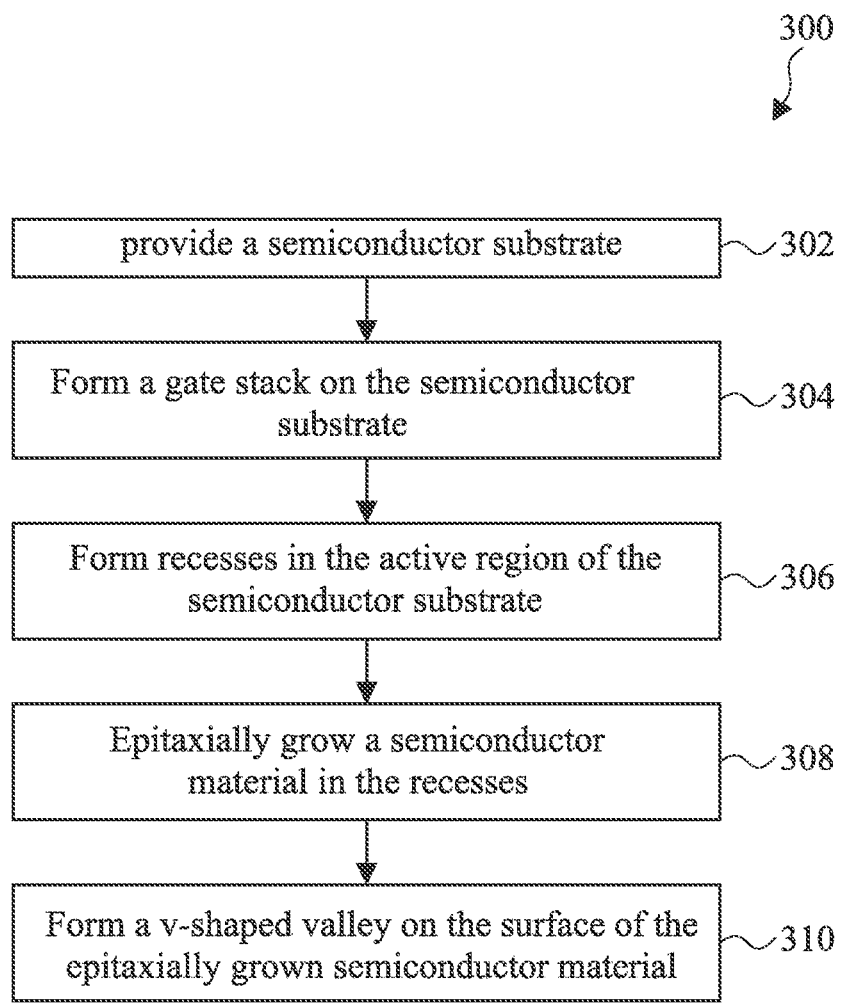
FIG. 3 shows a flow chart to illustrate a method making a semiconductor structure constructed according to various aspects of the present disclosure in accordance with some embodiments.

FIG. 3 shows a flowchart of a method 300 to form a semiconductor structure (e.g., semiconductor structure 100) constructed according to various aspects of the present disclosure in some embodiments. The semiconductor structure 100 is provided as an example and is not intended to limit the scope of the method. The method 300 starts in block 302 with providing a semiconductor substrate 110.

The method 300 continues in block 304 with forming gate stack 120. The formation of the gate stack 120 includes various depositions and patterning. Other features, such as gate spacers 126 and lightly doped drain (LDD) features may be further formed.

Subsequently, the method 300 continues in block 306 with forming recesses 132. The recesses 132 are formed in the semiconductor substrate within the active region 114 by an etching process. In some embodiments, the recesses 132 may be formed using, such as a wet (and/or dry) etch process selective to the material of the substrate 110. A cleaning process may follow the etching process using a suitable chemical. The etching and/or cleaning processes may introduce metal residuals to the recesses 132.

Referring still to FIG. 3, the method 300 continues in block 308 with forming S/D feature 138 by epitaxial growing in the recesses 132 with a semiconductor material either different from or the same as that of the substrate 110. The deposition may occur on the substrate 110 and also on other regions (such as STI and gate stacks) with different deposition rates and structures. The semiconductor material deposited in the recesses 132 is crystalline.

The method 300 continues to block 310 with forming a v-shaped valley 140 on the surface of each S/D feature. Such formation of the v-shaped valley mat be performed using the chemical vapour etching. More particularly, a chlorine-containing gas (such as HCl, $Cl_2$ or both) is used to perform the etching process of the v-shaped valley.

The present disclosure provides a method and structure of a FET that provide a greater area at the interface between the FET's drain/source (D/S) features and metal silicide layers (e.g., TiSi layer). Since the area at the interface is inversely proportional to the contact resistance, a smaller area may in turn increase D/S contact resistance, which may disadvantageously affect performance of the FET. The method includes forming a v-shaped valley on the top surface of epitaxially grown D/S features. Compared with the flat top surface of the D/S features that are generally used in conventional FET structures, the disclosed method and structure provide a greater area by forming the valley on the top surface of the D/S features. As such, the D/S contact resistance value between the D/S features and the later deposited metal silicide layer may be reduced.

The semiconductor structure 100 may be used in various applications, such as logic circuit, dynamic random access memory (DRAM), static random access memory (SRAM) cells, flash memory, or imaging sensor. The semiconductor structure is a planar FET structure or alternatively a FinFET structure.

The present disclosure provides a method in accordance with some embodiments. The method includes forming a recess in a source/drain region of a semiconductor substrate, wherein the semiconductor substrate is formed of a first semiconductor material. The method further includes epitaxially growing a second semiconductor material within the recess to form a S/D feature in the recess, and removing a portion of the S/D feature to form a v-shaped valley extending into the S/D feature.

The present disclosure provides a method in accordance with some embodiments. The method includes forming a recess in a source/drain region of a semiconductor substrate, wherein the semiconductor substrate is formed of a first semiconductor material. The method further includes epitaxially growing a second semiconductor material and a third semiconductor material within the recess to form a S/D feature, and removing a portion of the S/D feature to form a v-shaped valley extending into the S/D feature.

The present disclosure provides an integrated circuit (IC) structure in accordance with some embodiments. The integrated circuit structure includes a semiconductor substrate, a gate stack formed on the semiconductor substrate, and adjacent to the gate stack, source and drain (S/D) features of a second semiconductor material, wherein each of the S/D features includes a v-shaped valley that extends into the S/D feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
    a gate stack disposed over a semiconductor substrate; and
    a source/drain feature disposed in the semiconductor substrate adjacent the gate stack, wherein the source/drain feature includes:
        a first semiconductor material including a dopant at a first concentration;
        a second semiconductor material disposed over the first semiconductor material, the second semiconductor material including the dopant at a second concentration that is greater than the first concentration; and
        a third semiconductor material disposed over the second semiconductor material, the third semiconductor material including the dopant at a third concentration that is less than the second concentration, wherein a top surface of the third semiconductor material defines a recess.

2. The device of claim 1, further comprising a silicide feature disposed within the recess such that the silicide feature physically contacts the top surface of the third semiconductor material.

3. The device of claim 2, further comprising a contact disposed directly on the silicide feature.

4. The device of claim 1, wherein the top surface of the third semiconductor material includes a first portion aligned in a [111] crystalline orientation and a second portion aligned in the [111] crystalline orientation.

5. The device of claim 4, wherein the first portion aligned in the [111] crystalline orientation intersects the second portion aligned in the [111] crystalline orientation.

6. The device of claim 1, wherein the third concentration is greater than the first concentration.

7. The device of claim 1, further comprising a sidewall spacer disposed along a sidewall of the gate stack, and wherein the third semiconductor material directly interfaces with the sidewall spacer.

8. A device comprising:
    a source/drain feature disposed in a substrate, wherein the source/drain feature includes:
        a first semiconductor material including a dopant at a first concentration;
        a second semiconductor material disposed directly on the first semiconductor material, the second semiconductor material including the dopant at a second concentration that is greater than the first concentration; and
        a third semiconductor material disposed directly on the second semiconductor material, the third semiconductor material including the dopant at a third concentration that is less than the second concentration, wherein a top surface of the third semiconductor material includes a first portion extending non-parallel to a top surface of the substrate and a second portion extending non-parallel to the top surface of the substrate.

9. The device of claim 8, wherein the first portion of the top surface of the third semiconductor material intersects the second portion of the top surface of the third semiconductor material.

10. The device of claim 8, further comprising a silicide feature disposed directly on the first and second portions of the top surface of the third semiconductor material.

11. The device of claim 10, wherein the first portion of the top surface of the third semiconductor material is aligned in a [111] crystalline orientation and the second portion of the top surface of the third semiconductor material is aligned in the [111] crystalline orientation.

12. The device of claim 8, wherein the dopant is a p-type dopant.

13. The device of claim 8, wherein the dopant is an n-type dopant.

14. The device of claim 8, wherein the substrate defines a recess and the first, second, and third semiconductor materials are entirely disposed within the recess.

15. An integrated circuit (IC) structure, comprising:
    a semiconductor substrate;
    a gate stack formed on the semiconductor substrate; and
    adjacent to the gate stack, source and drain (S/D) features, wherein each of the S/D features includes a v-shaped valley that extends into the S/D feature, wherein the S/D features include three semiconductor layers, each of the three semiconductor layers with distinct doping concentration.

16. The IC structure of claim 15, wherein the semiconductor substrate is formed of a first semiconductor material and the S/D features are formed of a second semiconductor material.

17. The IC structure of claim 16, wherein the first and second semiconductor materials are different from each other.

18. The IC structure of claim 16, wherein
    the first semiconductor material is silicon; and
    the second semiconductor material includes a material selected from the group consisting of silicon, silicon carbon, and silicon germanium.

19. The IC structure of claim 15, wherein a depth of the v-shaped valley that extends into the S/D feature is about 5 to 20 nanometers.

20. The IC structure of claim 15, wherein the semiconductor substrate defines a recess and at least one of the S/D features is entirely disposed within the recess.

* * * * *